United States Patent [19]
Murphy-Boesch et al.

[11] Patent Number: 4,633,181
[45] Date of Patent: Dec. 30, 1986

[54] APPARATUS AND METHOD FOR INCREASING THE SENSITIVITY OF A NUCLEAR MAGNETIC RESONANCE PROBE

[75] Inventors: Joseph A. Murphy-Boesch, San Francisco; Alan P. Koretsky, Oakland, both of Calif.

[73] Assignee: Regents of the University of Calif., Berkeley, Calif.

[21] Appl. No.: 522,150

[22] Filed: Aug. 11, 1983

[51] Int. Cl.[4] .................................................. G01R 33/20
[52] U.S. Cl. ........................................ 324/322; 324/318
[58] Field of Search ............... 324/307, 311, 313, 314, 324/315, 316, 318, 322, 61 QS, 61 QL, 57 Q, 128

[56] References Cited

U.S. PATENT DOCUMENTS

| 3,502,963 | 3/1970 | Hlavka | 324/322 |
| 3,603,871 | 9/1971 | Caunter | 324/322 |
| 4,439,733 | 3/1984 | Hinshaw et al. | 324/318 |

FOREIGN PATENT DOCUMENTS

| 2225899 | 12/1973 | Fed. Rep. of Germany | 324/322 |
| 1329776 | 9/1973 | United Kingdom | 324/318 |

OTHER PUBLICATIONS

S. Kan, *A Single-Coil Triple Resonance Probe for NMR Experiments*, pp. 887-890, Rev. Sci. Instrum. 51(7), Jul. 1980.
Matson, *NMR Probe Double-Tuned Matching Boxes for Double-Resonance FT Experiments on Hydrogen and Fluorine*, pp. 481-483, Journal of Magnetic Resonance 25, 1977.
Yagi, *NMR Marginal Oscillator with MOS-FET Operating at Low Temperature*, pp. 1794-1798, Japanese Journal of Applied Physics, vol. 12, No. 11, Nov. 1973.

Primary Examiner—Stewart J. Levy
Assistant Examiner—Kevin D. O'Shea
Attorney, Agent, or Firm—Townsend and Townsend

[57] ABSTRACT

The discovery has been made that coil-to-ground parasitic losses substantially reduce the sensitivity of a nuclear magnetic resonance probe used in nuclear magnetic resonance analyses of lossy dielectic (i.e., relatively conductive) samples, such as biological tissue. A probe circuit is disclosed in which a balancing impedance is inserted for substantially reducing the influence of coil-to-ground parasitics. The probe circuit resulting from the insertion of the balancing impedance markedly increases sensitivity. Concomitantly, the quality factor of the probe circuit and the signal-to-noise ratio of nuclear magnetic resonance signals are substantially improved. The disclosed probe circuit can be incorporated in nuclear magnetic resonance analysis systems where the sample coil is either implanted or placed on the surface of a sample; where the sample coil forms a portion of a large-scale imaging system; or the sample coil is used in a traditional analytical mode with a sample contained in a glass tube.

45 Claims, 13 Drawing Figures

APPARATUS AND METHOD FOR INCREASING THE SENSITIVITY OF A NUCLEAR MAGNETIC RESONANCE PROBE

BACKGROUND OF THE INVENTION

This invention relates to circuitry for responding to electromagnetic signals and, more particularly, to probes for transmitting and/or receiving electromagnetic signals characteristic of signals emitted by nuclei in nuclear magnetic resonance analyses. Specifically, the invention is directed to a nuclear magnetic resonance probe having increased sensitivity, especially in circumstances where the sample or specimen under examination, such as biological tissue subjected to medical diagnosis, is a lossy dielectric material.

When nuclei possessing magnetic moments are placed in a strong magnetic field, they align and precess at their Larmor frequency, a characteristic frequency generally occurring in the radio frequency range. Particular nuclei can be excited by a burst of radio frequency (RF) electromagnetic energy at approximately their Larmor frequency. When the applied RF electromagnetic field is removed, the nuclei relax toward their equilibrium conditions, emitting RF signals which are characteristic of the molecular environments in which the nuclei reside. This phenomenon is known as nuclear magnetic resonance (NMR) which can be used for obtaining structural and dynamic information about the molecules of a sample.

In the past ten years, the application of NMR to biological examinations has proven to be enormously fruitful. In particular, the ability to study metabolism and produce images in vivo has assured increasing use of NMR in medicine. One of the major drawbacks of the NMR technique, however, has been its lack of sensitivity when compared with other spectroscopic techniques. It is widely accepted that much of the loss in sensitivity lies in the probe of the nuclear magnetic resonance analysis system and occurs in the tuned circuit which excites and detects the nuclei of interest. In accordance with the invention, an apparatus and method are provided which substantially increase the sensitivity of a nuclear magnetic resonance probe, especially when examinations are performed on biological tissue.

Exciting and detecting nuclear magnetic resonances generally requires a nuclear magnetic resonance probe having a tuned circuit which resonates at approximately the Larmor frequency of the nuclei. The circuit for known nuclear magnetic resonance probes resembles that shown in FIG. 1. See D. I. Hoult and R. E. Richards, *J. Mag. Res.* 24, 71–85 (1976), at page 81, FIG. 5. The capacitor $C_1$ is used for tuning the probe circuit, while the capacitor $C_2$ is used for impedance matching the circuit to external probe electronics. The losses in the probe circuit can originate in numerous places, the most elemental of them being the resistance of the sample coil $L_s$ itself. The resistance $R_p$ represents the parallel equivalent of the series resistance shown in FIG. 5 of Hoult and Richards and is proportional to the quality factor or Q of the circuit.

Other losses can be traced to losses in the sample. Usually, when a sample of biological tissue is introduced into the sample coil $L_s$, rather large losses are incurred, and the circuit Q falls dramatically. Much of these losses can be attributed directly to the conductivity of the ions in tissue. The intracellular concentration of potassium ions within tissue is typically about 150 mM, while the extracellular fluid contains about 150 mM sodium chloride, and the conductivity of these samples causes radio frequency losses which can adversely affect the signal-to-noise ratio of the NMR spectra. Hoult and Lauterbur have identified these sample losses as either inductive or dielectric in nature. See D. I. Hoult and Paul C. Lauterbur, *J. Mag. Res.* 34, 425–433 (1979). Unfortunately, as Hoult and Lauterbur indicate, the sensitivity of the probe circuit is substantially degraded by these losses, varying roughly as $Q^{\frac{1}{2}}$ at a fixed frequency.

Dielectric losses are indicated to be associated with the distributed capacitance of the sample coil $L_s$ and arise from lossy materials in the vicinity of the sample coil. Hoult and Lauterbur derive an expression which describes the losses of the probe circuit when the sample coil $L_s$ is completely immersed within a lossy dielectric. The effect upon the probe circuit is represented by the resistance $R_d$ and the capacitance $C_d$ shown in FIG. 2A connected in parallel with the sample coil $L_s$.

D. G. Gadian and F. N. H. Robinson, *J. Mag. Res.* 34, 449–455 (1979), have modified the circuit shown in FIG. 2A to account for an arrangement often employed in the use of nuclear magnetic resonance probes, where the sample is contained in a glass tube which in turn is separated from the sample coil $L_s$ by an air gap and, therefore, insulated from the sample coil. In their circuit, shown in FIG. 2B, the capacitance $C_3$ represents the distributed coil-sample capacitance of this air and glass insulation.

Inductive losses are also a consequence of the conductivity of the sample and originate from eddy currents induced in the sample by the alternating RF magnetic field. Little can be done to reduce such losses, except to make the sample less conductive. Cf. Donald W. Alderman and David M. Grant, *J. Mag. Res.* 36, 447–451 (1979).

The previous works indicate that the dielectric losses can be eliminated where the sample is contained in a glass tube by interposing a Faraday shield between the sample coil $L_s$ and the sample. The magnetic (or inductive) losses are intrinsic and, therefore, unavoidable. See P. Mansfield and P. G. Morris, *Advances in Magnetic Resonance: NMR Imaging in Biomedicine,* Supplement 2, Academic Press, New York (1982), at page 201.

Unfortunately, the previous works describing losses in various nuclear magnetic resonance probes have been found to inadequately describe the losses encountered in the analysis of lossy dielectric samples, such as biological tissue. In particular, the approach has been to treat the source of dielectric losses as occurring purely across the sample coil $L_s$. What has gone unnoticed is that for purposes of shielding, whether or not the sample is in a glass tube, but primarily in the former case, the sample and probe circuit are generally contained in a metal enclosure to which the ground lead of the circuit is attached. The basis of the present invention is the discovery that additional dielectric losses associated with the distributed capacitances between the sample coil $L_s$ and the shield and other ground points of the probe circuit are present. Such dielectric losses are associated with the coil-to-ground impedance being decreased by the presence of the lossy dielectric sample within the sample coil $L_s$, which provides an insidious current leakage path. In addition, in circumstances where the physical dimensions of the sample are comparable to a wavelength, radiative losses or transmission losses appear. The result is parasitic losses from the sample coil $L_s$ through the sample to ground, which increases the resistive loss of the probe circuit, thereby adversely affecting the sensitivity of the circuit. In accordance with the discovery of the invention, a tuning and impedance balancing apparatus and method are provided by which the influence of such parasitic losses is reduced, whereby the sensitivity of the probe circuit is increased.

SUMMARY OF THE INVENTION

The present invention provides an apparatus and method for increasing the sensitivity of a probe used for nuclear magnetic resonance analysis. In accordance with the invention, the voltage across the sample coil included in the probe circuit is balanced for improving the quality factor or Q of the circuit. The apparatus and method of the invention, by which the voltage across the sample coil is balanced, derivatively improve the signal-to-noise ratio of the nuclear magnetic resonance signals, especially during examination of a lossy dielectric sample, such as biological tissue.

The invention provides a nuclear magnetic resonance probe circuit having an improved quality factor or Q in the presence of coil-to-ground parasitics encountered in nuclear magnetic resonance analysis of a specimen, comprising: a sample coil positioned in close proximity to the specimen; a tuning circuit element connected to the sample coil, the sample coil and tuning circuit element substantially forming a resonant circuit tuned to a selected Larmor frequency; and a balanced impedance circuit means connected to the sample coil and tuning circuit element for balancing the voltage across the sample coil, thereby reducing the influence of coil-to-ground parasitics. Preferably, the tuning circuit element comprises a tuning capacitor, and the balanced impedance circuit means comprises a balanced impedance matching capacitance for balancing the voltage across the sample coil. The balanced impedance matching capacitance preferably comprises a first impedance matching capacitor connected between the sample coil and an ungrounded output terminal and a second impedance matching capacitor connected between the sample coil and a grounded output terminal, the sample coil being connected in series circuit between the first and second impedance matching capacitors across the ungrounded and grounded output terminals. Preferably, the tuning capacitor is connected in parallel circuit with the sample coil. Alternatively, the tuning capacitor is connected between the grounded output terminal and a first junction, where the first impedance matching capacitor is connected to the sample coil; and the second impedance matching capacitor is connected between the sample coil and a second junction, where the tuning capacitor is connected to the grounded output terminal. In either case, at least one of the first and second impedance matching capacitors is preferably adjustable for matching the impedance across the ungrounded and grounded output terminals to a predetermined impedance, for example, approximately 50 ohms.

Also, a method is provided in accordance with the invention for improving the signal-to-noise ratio of nuclear magnetic resonance signals detected in the presence of coil-to-ground parasitics encountered in nuclear magnetic resonance analysis of a specimen by a probe circuit having a sample coil and a tuning circuit element, the sample coil and tuning circuit element substantially forming a resonant circuit across an ungrounded output terminal and a grounded output terminal, the resonant circuit being tuned to a selected Larmor frequency, comprising the steps of: positioning the sample coil in close proximity to the specimen; and inserting a balanced impedance circuit means for balancing the voltage across the sample coil, whereby the influence of coil-to-ground parasitics is reduced. Preferably, the tuning circuit element comprises a tuning capacitor, and the balanced impedance circuit means comprises a balanced impedance matching capacitance for balancing the voltage across the sample coil. The probe circuit preferably further has a first impedance matching capacitor between the sample coil and the ungrounded output terminal, and the step of inserting the balanced impedance circuit means for balancing the voltage across the sample coil comprises inserting a second impedance matching capacitor between the sample coil and the grounded output terminal, the sample coil being connected in series circuit between the first and second impedance matching capacitors across the ungrounded and grounded output terminals. Preferably, the tuning capacitor is connected in parallel circuit with the sample coil. Alternatively, the first impedance matching capacitor is inserted between the ungrounded output terminal and a first junction, where the tuning capacitor is connected to the sample coil; and the second impedance matching capacitor is inserted between the sample coil and a second junction, where the tuning capacitor is connected to the grounded output terminal. In either case, at least one of the first and second impedance matching capacitors is preferably adjustable for matching the impedance across the ungrounded and grounded output terminals to a predetermined impedance, for example, approximately 50 ohms, and the method further comprises the step of adjusting the at least one of the first and second impedance matching capacitors for matching the impedance across the ungrounded and grounded output terminals to the predetermined impedance.

The apparatus and method of the invention yield a signal-to-noise improvement in the nuclear magnetic resonance signals detected in the examination of biological tissue or other lossy dielectric samples. The invention is applicable to probes used in analytical nuclear magnetic resonance analysis systems, as well as implanted, surface, and imaging nuclear magnetic resonance analysis systems, and solves many of the heretofore experienced drawbacks of the NMR technique compared to other spectroscopic techniques, such as radiation and ultrasonic scans.

BRIEF DESCRIPTION OF THE DRAWINGS

The above and other features and the concomitant advantages of the present invention will be better understood and appreciated by those skilled in the art in view of the description of the preferred embodiments given below in conjunction with the accompanying drawings. In the drawings:

FIG. 2, comprising

FIG. 4, comprising

FIG. 6, comprising

Finally.

GENERAL DESCRIPTION

Figure 1:
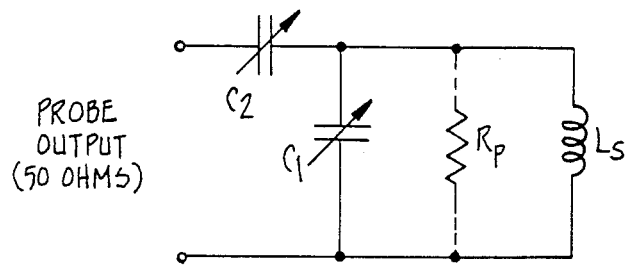
FIG. 1 is a schematic diagram of a known nuclear magnetic resonance probe circuit employing conventional tuning and impedance matching without accounting for any influences of the sample. $L_s$ is the sample coil, $C_1$ and $C_2$ are the tuning and impedance matching capacitors, respectively, and $R_p$ represents the parallel equivalent of the sample coil resistance.

The basic concepts of NMR are well known, as are a variety of techniques for generating nuclear magnetic resonance signals. Detailed descriptions are found in the literature, notably the text of Farrar and Becker entitled *Pulse and Fourier Transform NMR—Introduction to Theory and Methods,* Academic Press, New York (1971). The following is a brief summary of this technology in order to facilitate an understanding of the present invention.

Certain types of nuclei, by virtue of the number of protons and neutrons therein, have a net magnetic moment which enables them to respond to a magnetic field. All nuclei with an odd number of protons or neutrons behave, in effect, as small magnets. The effect of a steady external magnetic field on such nuclei is to cause alignment of the direction of net angular momentum or spin of the nuclei in the field direction, or, more precisely, to cause the nuclei to precess about an axis parallel to the field direction. The precession frequency is directly proportional to the intensity of the magnetic field, the proportionality constant being the gyromagnetic ratio for the nuclei in question. This relationship is known as the Larmor equation, and the frequency itself is commonly designated the Larmor frequency. The magnetic fields generally used in nuclear magnetic resonance analysis are static and unidirectional, resulting in a nuclear spin alignment which is uniform throughout the sample under examination.

Where a magnetic field gradient exists through the sample, or if inhomogeneities exist in the imposed magnetic field, nuclei having the same gyromagnetic ratio will have different Larmor frequencies in accordance with their positions within the sample. A volume of nuclei in the sample can thus be conceptualized as having a range of precession frequencies centered about a given Larmor frequency.

In addition to being under the influence of a magnetic field, the nuclei of interest are placed within the range of a nuclear magnetic resonance signal detector or probe. The probe circuit generally includes a sample coil connected to a radio frequency signal receiver. The sample coil is appropriately oriented for detecting signals emitted by nuclei which have been excited away from their equilibrium states by a particular energy increment. In the configuration generally used, the sample coil detects a signal only when the net macroscopic magnetization has a component in the plane perpendicular to the direction of the static magnetic field. Therefore, an energy increment which modifies the nuclear magnetization in this manner will cause a detectable signal to occur.

Excitation is accomplished by irradiating the nuclei with an electromagnetic signal or carrier wave of a characteristic RF. On absorption of energy from the RF magnetic field, the magnetic moments tip to a different angle, but the precession frequency remains constant. For maximum effect, the carrier is oriented in a plane perpendicular to the direction of the static magnetic field. If the frequency of the carrier is equal or very close to the precession frequency of the nuclei, the latter will undergo a change in angular momentum according to the Bloch equations. The result is a nutation of the nuclear spins away from the axis of the static magnetic field by an amount in accordance with the amplitude of the carrier and the length of time it is applied.

The slow passage analysis involves slowly sweeping the carrier applied to a sample in a fixed magnetic field (or, alternatively, slowing sweeping the field with a fixed carrier). Adiabatic rapid passage requires that the sweep rate of either the carrier or magnetic field be between certain limits. The slow passage and rapid passage methods are usually referred to as continuous wave (CW) techniques, since the carrier is applied continuously while the spectrum is observed.

A third method of observation makes use of short bursts or pulses of RF at a discrete frequency. The observation of the nuclear spins is made after the RF is turned off. Such a method is called a pulse or free precession technique. Combination methods, in which RF pulses are applied but the transient behavior of the nuclear spins is studied while the RF pulse is on, have also been developed.

Pulse methods are often much more efficient than CW methods, thereby producing a very significant savings in time or improvement in signal-to-noise. For illustrative purposes, therefore, the focus of the description is on pulse methods rather than CW methods, although the present invention has application to both CW and pulse NMR techniques.

Due to the orientation of the sample coil, detectable signals are generated only when the nuclear spins have been nutated away from their equilibrium direction (the direction of the static magnetic field). The maximum signal is that resulting from a 90° nutation.

The initial effect of the irradiation is to cause the magnetic moments of the nuclei to rotate in phase, thereby generating a detectable signal. The intensity of this signal decays, however, as the magnetic moments begin to spread out (dephase) due to both the exchange of energy between neighboring nuclei and inhomogeneities in the magnetic field. This decay is known as free induction decay (FID), and the time needed for the signal to decay to 1/e or approximately one-third of its initial value is called the $t_2^*$ relaxation time. Other common names are the spin-spin or transverse relaxation time.

The signal can be regenerated, however, by reversing the nuclear spins in order to cause the magnetic moments to rotate in the opposite direction. When so reversed, the nuclear spins pass back through the point where they are all in phase, and a signal thus reappears in the sample coil. The intensity of the signal rises to a maximum at the point where the magnetic moments are precisely in phase, at least in phase to the highest degree possible. The time interval between this point and the instant at which the spin reversal took place is exactly equal to the time interval between the initial (signal-generating) nutation and the spin reversal. This regenerated signal is commonly known as the spin echo.

Further spin echoes can be generated by additional nuclear spin reversals. In each case, the spin echo peaks at a time interval following the spin reversal equal to the time interval between the previous spin echo peak and the spin reversal.

During all this time, the torque exerted on the nuclei by the static magnetic field tends to realign the nuclei in the direction of the static magnetic field. When complete realignment has been regained, the macroscopic magnetization will have returned to its equilibrium value, and no signal appears in the sample coil. The period of time required for this to happen depends upon the particular value of the net magnetic moment and is commonly referred to as the spin-lattice or longitudinal relaxation time, with a characteristic time constant commonly designated $T_1$, referring to a decay factor of 1/e. Although the spin-lattice relaxation is asymptotic in character, the time for total relaxation, within the normal limits of detection, ranges from about 0.1 to about 10 seconds. This time period is generally considerably longer than the spin-spin relaxation time.

Clearly, as the spin-lattice relaxation becomes more and more advanced, the signals steadily decrease in intensity. In order to be detectable, therefore, all signals must remain within the spin-lattice relaxation time, and the closer these signals are to the original signal-generating excitation, the stronger and more easily detectable they are.

Either the FID or a spin echo can be used in the process of the present invention as the detectable nuclear magnetic resonance signal. Focusing on one or the other is readily achieved by selecting a particular relaxation time following the last irradiation for emphasis by the signal detector.

Detected nuclear magnetic resonance signals are related to the rate of linear displacement, in a predetermined direction, of nuceli within a sample under the influence of a static unidirectional magnetic field within the range of a nuclear magnetic resonance probe which is oriented for detecting a zero signal, when the spins of the nuclei are equilibrated to precessions at Larmor frequencies in accordance with the intensity of the magnetic field, and a positive signal, when the spins are excited away from the equilibrated state of a predetermined energy increment. Generally, the nuclear magnetic resonance probe circuit sample coil is oriented for detecting only those components of the nuclear magnetization lying perpendicular to the direction of the static magnetic field.

In order to more readily understand the features of the nuclear magnetic resonance probe circuit in accordance with the invention, reference will now be made to FIG. 3 which is a block diagram of a pulsed nuclear magnetic resonance analysis system capable of performing analyses in spectroscopy or imaging at almost any level of sophistication. The performance of this system is susceptible to being improved by incorporation of the nuclear magnetic resonance probe circuit of the present invention.

Figure 3:
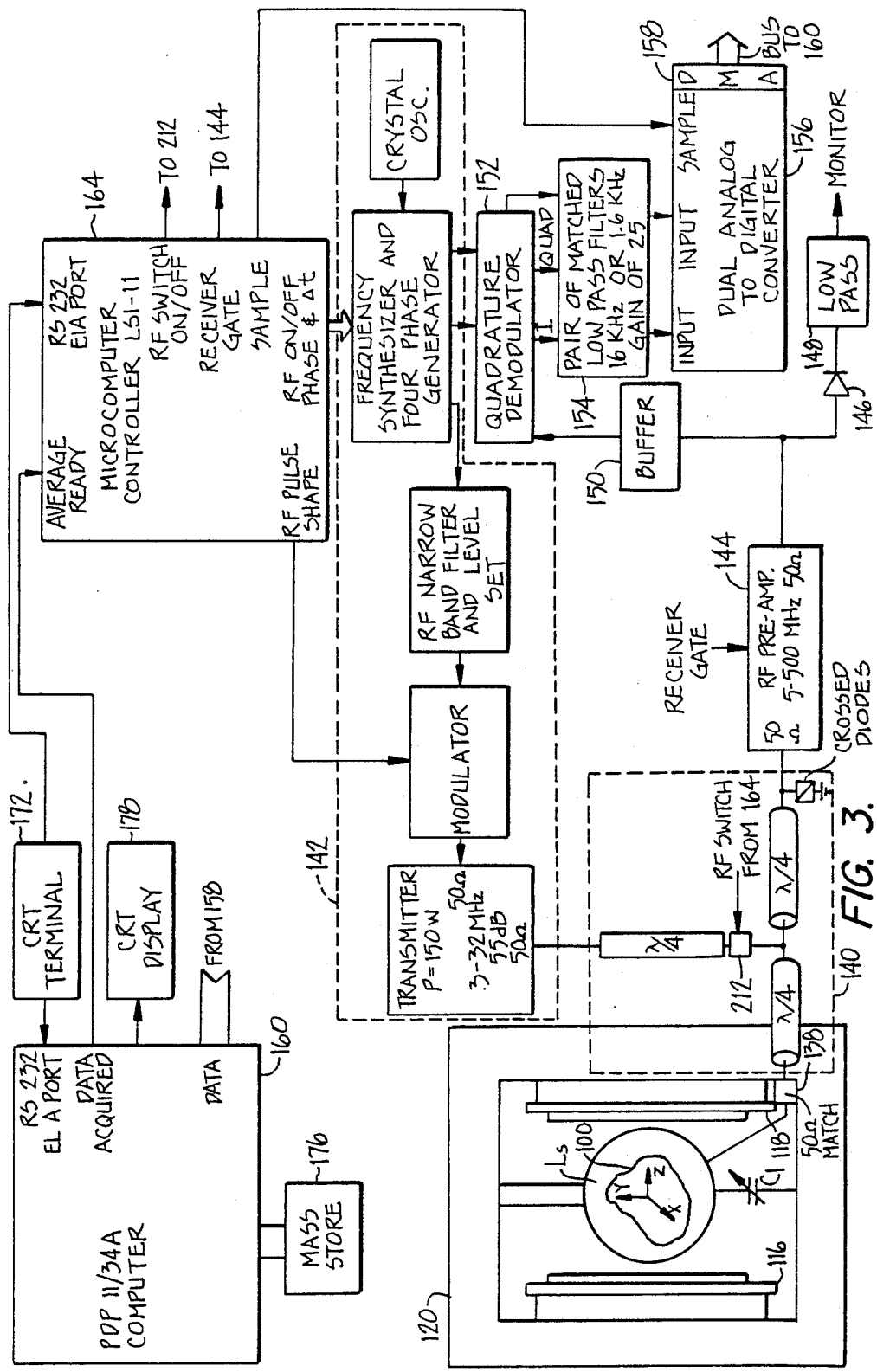
FIG. 3 is a block diagram of a nuclear magnetic resonance analysis system. Such a system is configurable to include the improved nuclear magnetic resonance probe circuit of the present invention.

As shown in FIG. 3, a sample 100 is disposed within a sample coil $L_s$ oriented about the nominal X axis of a Cartesian coordinate system. The sample coil $L_s$ is utilized in irradiation of the sample 100, to pick up the nuclear magnetic resonance signals generated by the sample, and, further, suitably provides a support holder for the sample.

The sample coil $L_s$ is, in turn, disposed between respective pole faces 116 and 118 of a main magnet 120. The magnet 120 is utilized to generate the static magnetic field $B_0$ along the Z direction of the nominal coordinate system (transverse to the axis of the sample coil $L_s$). The magnet 120 suitably comprises a conventional iron core having wound thereabout conductors cooperating with a power supply (not shown) and is suitably water cooled in order to maintain a constant temperature.

The sample coil $L_s$ is electrically connected to a tuning capacitor $C_1$ and through an appropriate impedance matching network 138 to one terminal of a directional network or circular (magic-T network) 140. The magic-T network 140 selectively couples the sample coil $L_s$ (in a mutually exclusive manner) to a transmitter 142 and to a preamplifier 144. As is well known in the art, the magic-T network 140 operates to connect the transmitter 142 to the sample coil $L_s$ during such times that the transmitter is transmitting and connects the sample coil to the preamplifier 144 during such periods when the transmitter is not transmitting.

The output signals from the preamplifier 144 are applied through a diode detector 146 and lowpass filter 148, if desired, for monitoring during tuning of the nuclear magnetic resonance analysis system and are applied through a buffer 150 to a demodulator 152. The demodulator 152 is suitably a quadrature demodulator receptive of signals indicative of the transmitted signal (as well as the received signal) and generates in-phase (I) and quadrature (QUAD) output signals (the quadrature output signal being 90° phase relative to the in-phase output signal).

The in-phase and quadrature demodulator output signals are applied through respective lowpass filters 154 to a two-channel analog-to-digital (A/D) converter 156. The A/D converter 156 is, in turn, connected through a direct memory access (DMA) interface 158 to a suitable computer 160.

Responsive to signals from a microcomputer controller 164, the A/D converter 156 takes a predetermined number of the demodulated signals and transmits the data to the main computer 160 (a memory 176) through the DMA 158. When a set of data is received by the main computer 160, it is stored in appropriate locations in the memory 176. The programming of the microcomputer controller 164 and main computer 160 through a terminal 172 is coordinated such that the data received from the DMA 158 can be properly interpreted with respect to sequence. Thereafter, a Fourier transform of the data can be performed, and the Fourier transforms can be displayed by means of a CRT display 178.

The requirements of a nuclear magnetic resonance probe are rather stringent. It must be small enough to fit easily between the pole faces 116 and 118 of the magnet 120 or in the bore of a superconducting solenoid. In general, it must be able to handle the large RF voltages present while a pulse is on; it must recover rapidly from such a powerful pulse and quickly receive and process the weak nuclear magnetic resonance signals following the pulse. It must also have sufficient sensitivity to generate nuclear magnetic resonance signals having a relatively high signal-to-noise ratio. The invention focuses on increasing the sensitivity of the nuclear magnetic resonance probe circuit and, more particularly, on improvement of the impedance matching network 138.

DESCRIPTION OF THE PREFERRED EMBODIMENTS

Figure 4A:
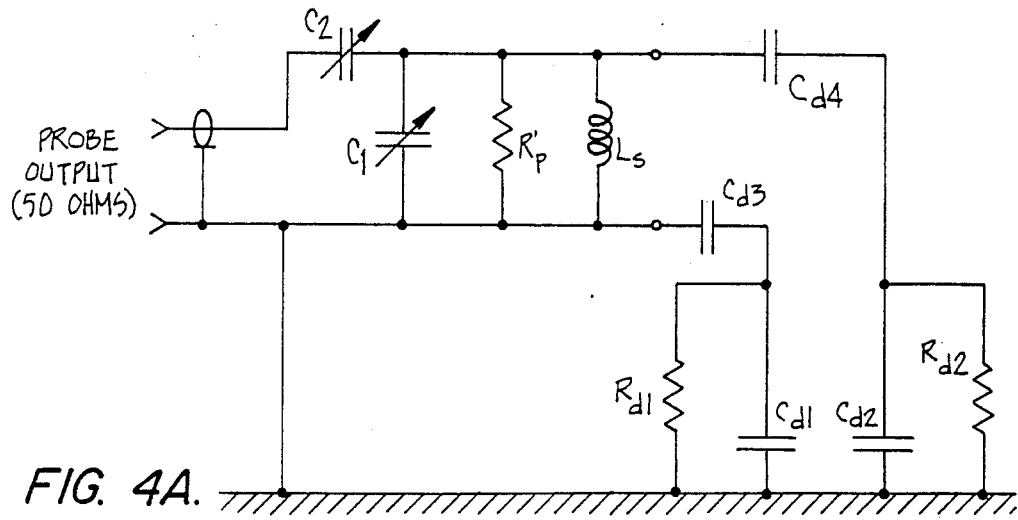
FIGS. 4A and 4B, is a schematic diagram of nuclear magnetic resonance probe circuits employing conventional tuning and impedance matching, which model the additional influences of coil-to-ground parasitics discovered in accordance with the invention. The probe circuit elements are designated similarly to those shown in FIG. 2, except that the resistance $R_p'$ represents the parallel combination of the resistances $R_p$ and $R_d$ or $R_d'$, and the capacitor $C_1$ incorporates the capacitance $C_d$ or $C_d'$. The branches $C_{d1}$ and $R_{d1}$, $C_{d2}$ and $R_{d2}$ represent the distributed influences of the coil-to-ground parasitics. The capacitance $C_\alpha$ and the resistance $R_\alpha$ are given by equations (1) and (2) below.

In accordance with the invention, the presence of coil-to-ground parasitic losses through the sample 100 has been discovered. These losses, which are dielectric losses, are represented by two lumped element circuits connected between the sample coil $L_s$ and ground as shown in FIG. 4A. The capacitances $C_{d3}$ and $C_{d4}$ represent the insulation surrounding the wire and small capacitances of the sample coil $L_s$. $R_{d1}$ and $R_{d2}$ account for the resistive losses in the sample 100, while the reactances in parallel with them are represented by the capacitances $C_{d1}$ and $C_{d2}$, respectively. The path length of the electric field through the sample 100 to ground is considered small compared with the wavelength at the frequency of interest.

Figure 4B:
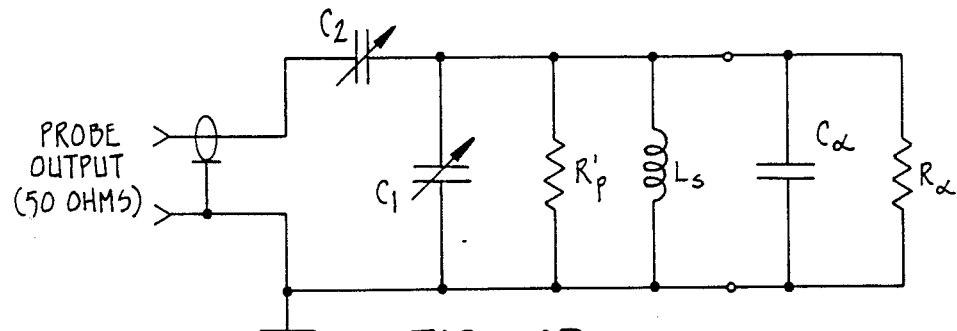

In order to simplify the circuit shown in FIG. 4A, the assumption can be made that the influence of the ground loop involving the first parasitic leg ($C_{d1}$, $R_{d1}$, and $C_{d3}$) can be neglected, since it is essentially shorted by the ground lead of the tuned circuit. As indicated in FIG. 4B, the remaining parasitic leg ($C_{d2}$, $R_{d2}$, and $C_{d4}$) transforms to the equivalent parallel components $C_\alpha$ and $R_\alpha$ given by the following equations.

$$C_\alpha = \frac{C_{d4} + \omega_0^2 R_{d2}^2 C_{d2} C_{d4}(C_{d2} + C_{d4})}{1 + \omega_0^2 R_{d2}^2 (C_{d2} + C_{d4})^2} \quad (1)$$

$$R_\alpha^{-1} = \frac{\omega_0^2 R_{d2} C_{d4}^2}{1 + \omega_0^2 R_{d2}^2 (C_{d2} + C_{d4})^2} \quad (2)$$

where $\omega_0/2\pi$ is the resonance frequency of the tuned circuit. It is apparent that the influence of the parasitic elements is to lower both the resonance frequency and the quality factor or Q of the probe circuit.

Figure 5:
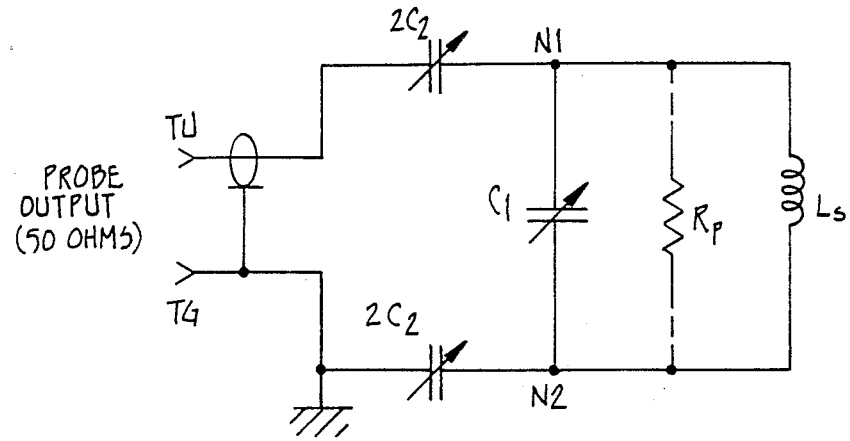
FIG. 5 is a schematic diagram of one embodiment of a nuclear magnetic resonance probe circuit in accordance with the invention. The probe circuit elements are designated similarly to those in FIG. 1. Capacitors $2C_2$ are balanced impedance matching capacitors.

One embodiment of a nuclear magnetic resonance probe circuit in accordance with the invention for reducing the influence of the coil-to-ground parasitics is shown in FIG. 5, which includes balanced impedance matching capacitors of equal size on both the ungrounded and grounded sides of the sample coil $L_s$. Considered in greater detail, the embodiment of the nuclear magnetic resonance probe circuit in accordance with the invention shown in FIG. 5 includes a sample coil $L_s$ (connected between a first node N1 and a second node N2) preferably positioned in close proximity to the sample 100. A tuning capacitor $C_1$ is included and connected (between the first node N1 and the second node N2) to the sample coil $L_s$, the sample coil and tuning capacitor substantially forming a (parallel) resonant circuit tuned to a selected Larmor frequency. A first impedance matching capacitor $2C_2$, connected between the sample coil $L_s$ and an ungrounded output terminal TU (connected, that is, between the first node N1 and the ungrounded output terminal), is also included. Finally, a second impedance matching capacitor $2C_2$ is included and connected between the sample coil $L_s$ and a grounded output terminal TG (that is, connected between the second node N2 and the grounded output terminal). Consequently, the sample coil $L_s$ is connected in series circuit between the first and second impedance matching capacitors $2C_2$ across the ungrounded and grounded output terminals TU and TG, respectively, so that the voltage across the sample coil is balanced.

The value of the capacitor $C_1$ is slightly less than that needed to tune to resonance, and the value of the impedance matching capacitors $2C_2$ in the case of a 50-ohm output impedance is given by $2C_2 \cong (C_1/50Q\omega_0)^{\frac{1}{2}}$, where $C_1$ is the capacitance of the tuning capacitor in farads and $\omega_0/2\pi$ is the resonance frequency in hertz. The value of the capacitor $2C_2$ represents approximately twice that of the impedance matching capacitor $C_2$ included in the known probe circuit shown in FIG. 1.

Figure 2A:
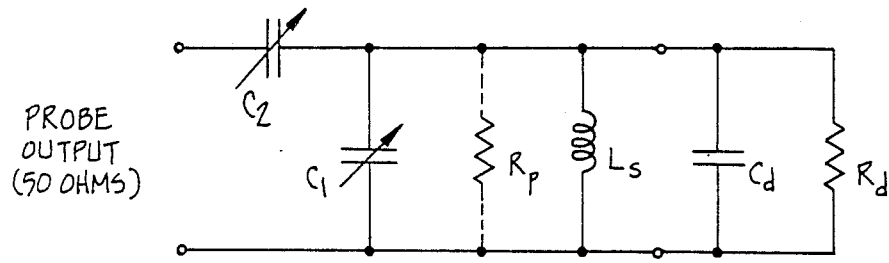
FIGS. 2A and 2B, is a schematic diagram of known nuclear magnetic resonance probe circuits employing conventional tuning and impedance matching, which account for coil-to-coil influences of the sample. $L_s$ is again the sample coil, $C_1$ and $C_2$ are again the tuning and impedance matching capacitors, respectively, and $R_p$ again represents the sample coil resistance. $C_d$ and $R_d$, $C_3$, $C_d'$, and $R_d'$ represent the coil-to-coil parasitics.
Figure 6A:
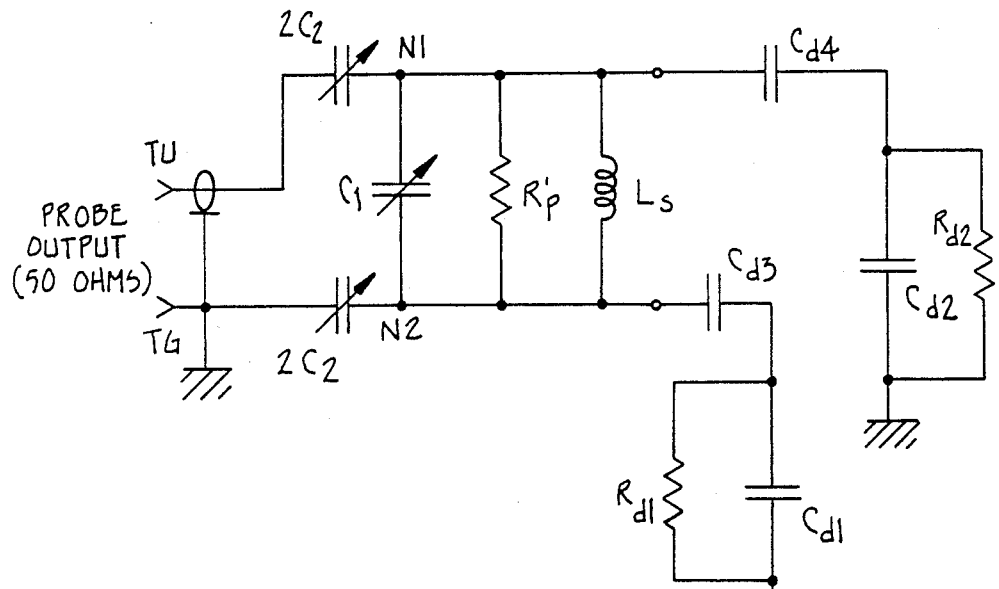
FIGS. 6A, 6B, and 6C, is a schematic diagram of nuclear magnetic resonance probe circuits in accordance with the invention, which model the influence of coil-to-ground parasitics on the tuning and impedance balancing probe circuit in accordance with the invention shown in FIG. 5, a reduced circuit assuming a high circuit Q, and an equivalent parallel circuit. The probe circuit elements are designated similarly to those shown in FIG. 4.

The probe circuit models shown in FIG. 6 illustrate the effect of parasitic elements on the embodiment of the nuclear magnetic resonance probe circuit in accordance with the invention shown in FIG. 5. As shown in FIG. 6A, the parasitic elements are modeled in a manner similar to that described earlier in connection with FIG. 2. The resistance $R_p'$ shown in FIG. 6A incorporates both the loss of the sample coil $L_s$ and the coil-to-coil sample losses (inductive and dielectric) modeled by Hoult and Lauterbur, as well as by Gadian and Robinson.

Figure 6B:
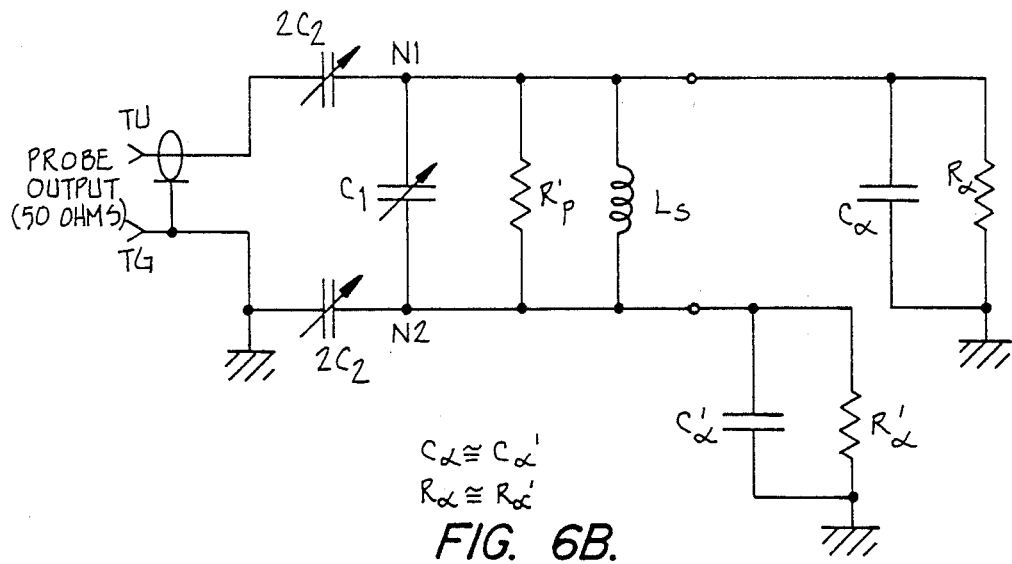

The parasitic elements can be reduced to their parallel equivalents as shown in FIG. 6B. The expressions for $C_\alpha$ and $R_\alpha$, $C_\alpha'$ and $R_\alpha'$ take the same form as presented above in equations (1) and (2), respectively.

In order to simplify the probe circuit model shown in FIG. 6B for the purpose of analysis, two assumptions can be made. First, the two parasitic legs of the model circuit shown in FIG. 6A are assumed to be equal, that is, $C_{d1}=C_{d2}$, $R_{d1}=R_{d2}$, and $C_{d3}=C_{d4}$. This is reasonable, since the sample coil $L_s$ is generally situated symmetrically within a nuclear magnetic resonance probe. The second assumption is that the Q of the circuit is high enough to make the impedance of the impedance matching capacitors $2C_2$ small compared with the 50-ohm output impedance. The sample coil $L_s$ is thereby balanced with respect to ground. Under these assumptions, the parasitic elements link in series through ground, and the model circuit further reduces to that shown in FIG. 6C.

Figure 6C:
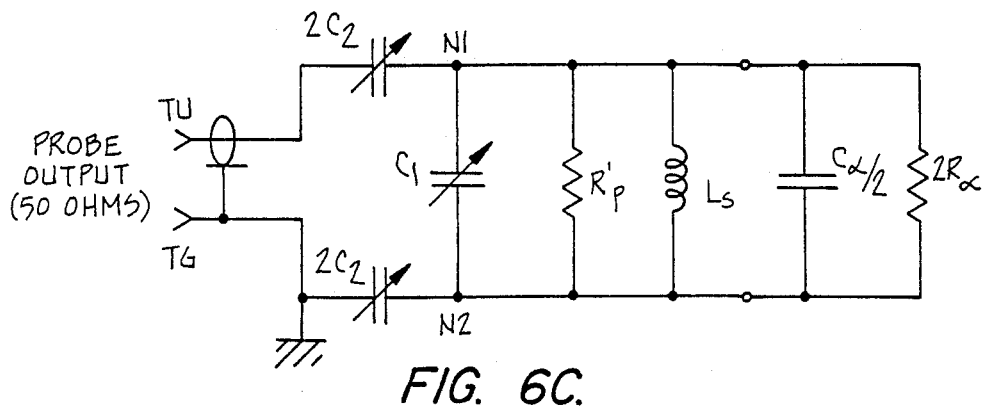

Comparing the probe circuit shown in FIG. 6C with that shown in FIG. 4B, it is readily apparent that the influence of the coil-to-ground parasitics has been substantially reduced. Considered in greater detail, the Q of a tuned, parallel RLC circuit is:

$$Q = R/\omega_0 L \qquad (3)$$

where R is the resistance in ohms; $\omega_0/2\pi$ is the resonance frequency in hertz; and L is the inductance in henries. Accordingly, on the one hand, the total Q of the known probe circuit shown in FIG. 4B can be expressed as:

$$\frac{1}{Q_{4B}} = \frac{1}{Q_p'} = \frac{1}{Q_a} \qquad (4)$$

where $Q_p' = R_p'/\omega_0 L_s$ and $Q_a = R_a/\omega_0 L_s$. On the other hand, the total Q of the probe circuit in accordance with the invention shown in FIG. 6C can be expressed as:

$$\frac{1}{Q_{6C}} = \frac{1}{Q_p'} + \frac{1}{2Q_a} \qquad (5)$$

where $Q_p'$ and $Q_a$ are as defined above in connection with equation (4). Under the conditions assumed above, that is, a high Q circuit and a symmetrically placed sample within the sample coil $L_s$, the influence of coil-to-ground parasitics on the tuning sensitivity and circuit Q have been reduced by the probe circuit in accordance with the invention by approximately one-half.

For nuclear magnetic resonance analyses involving biological samples, parasitic losses can dominate the Q of the probe circuit. According to the model of the probe circuit in accordance with the invention shown in FIG. 6C, these losses can be cut in half. In practice, there is an even larger increase in the circuit Q and a corresponding decrease in tuning sensitivity as will now be described.

In order to illustrate the improvement in the Q of the probe circuit in accordance with the invention shown in FIG. 5, a series of lumped parameter model circuits was constructed in order to measure the effects of coil-to-ground parasitics. All model circuits employed the same two-turn sample coil $L_s$ constructed from #22-gauge copper wire insulated with polyethylene tubing. The model circuits were anchored with adhesive copper tape to an unclad, epoxy-glass circuit board with a BNC connector attached for circuit Q measurements. In order to estimate the circuit Q for each model circuit, a Wavetek Model 1062 sweep generator, manufactured by Wavetek Corporation, 5808 Churchman, Beech Grove, Ind. 46107, and a 20 dB directional coupler were used for observing the reflected power from each circuit. The Q's for the model circuits were calculated by dividing the resonance frequency (approximately 100 MHz) by the full width at half height of the resonance curve displayed on an oscilloscope. The half-height points correspond to the frequencies at which 50% of the power is reflected. One-megahertz frequency markers were used to calibrate the oscilloscope sweep.

The known probe circuit shown in FIG. 1 with no parasitic elements was initially constructed. The capacitors $C_1$ and $C_2$ were selected to be variable ceramic capacitors with a 0.6 to 6 picofarad (pf) range. The known probe circuit was tuned to 100 MHz and matched to 50 ohms output impedance. The Q for this circuit was found to be 59. On the one hand, modifying the known probe circuit to the probe circuit in accordance with the invention shown in FIG. 5 had no measurable effect upon the circuit Q. This was expected since no parasitic elements had yet been added to the probe circuit. On the other hand, modification did not degrade probe circuit performance.

Figure 2B:
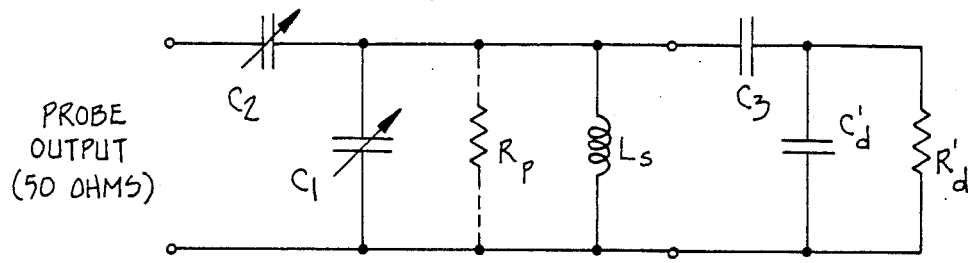

Next, coil-to-coil parasitic losses, thought to be the only losses prior to the discovery of the present invention, were modeled in accordance with the known probe circuit shown in FIG. 2B, with the resistance $R_d' = 22$ ohms and the capacitor $C_3 = 5$ pf. The capacitor $C_d'$ was omitted from the model circuit, since, in principle, its effect can be incorporated into the capacitor $C_3$. The parametric values were selected to simulate the influences upon circuit Q and tuning sensitivity based on experience with an in vivo nuclear magnetic resonance probe, which is explained shortly. The Q for this model circuit was measured to be 29, and again there was no measurable difference when the circuit was converted to the probe circuit in accordance with the invention shown in FIG. 5.

Finally, in order to model coil-to-ground parasitic losses, the probe circuit shown in FIG. 4A was constructed with $R_{d1} = R_{d2} = 22$ ohms, $C_{d3} = C_{d4} = 5$ pf, and $C_{d1}$ and $C_{d2}$ omitted for reasons explained earlier, namely, their effect can be incorporated into the capacitors $C_{d3}$ and $C_{d4}$, respectively. The Q for this circuit was 26, down from 59 for the unloaded circuit. Upon converting the model circuit to the probe circuit in accordance with the invention shown in FIG. 6A, the circuit Q improved to 45, indicating that the coil-to-ground losses were reduced by considerably more than the 50% predicted from equations (4) and (5) above.

In vivo nuclear magnetic resonance analysis often necessitates a length of transmission line between the sample coil $L_s$ and the tuning capacitor $C_1$. For example, $^{31}P$ spectroscopy on rat organs has been performed by implanting the sample coil $L_s$ around the organ of interest. The probe circuit used is shown in FIG. 7 and is a modification of the tuning and impedance balancing probe circuit of the invention described in connection with FIG. 5.

Figure 7:
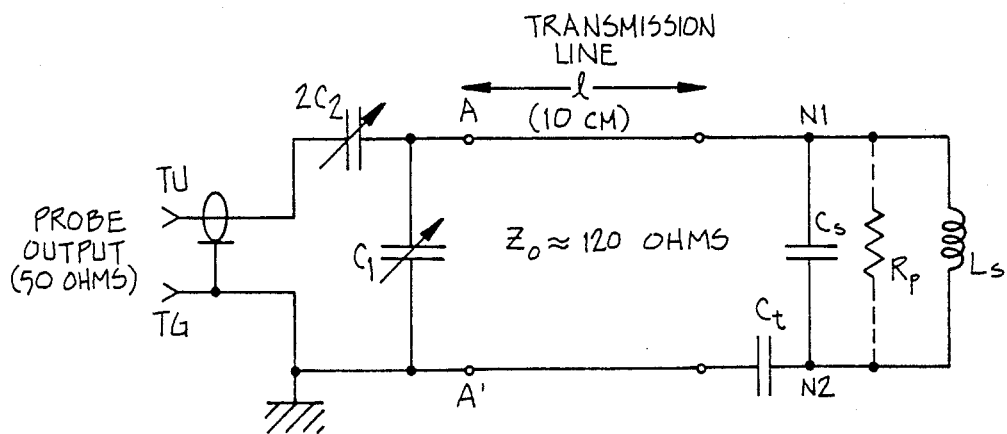
FIG. 7 is a schematic diagram of another tuning and impedance balancing nuclear magnetic resonance probe circuit in accordance with the invention for in vivo use wherein a length of transmission line is needed between the sample coil $L_s$ and the tuning and impedance matching capacitors, $C_1$ and $2C_2$, respectively. $C_s$ and $C_t$ are capacitors positioned near the sample coil $L_s$ for performing both partial tuning and partial impedance matching. $C_t$ is placed in the ground lead for balancing the voltage across the sample coil $L_s$.

Considered in greater detail, the embodiment of the nuclear magnetic resonance probe circuit in accordance with the invention shown in FIG. 7 includes a sample coil $L_s$ (connected between a first node N1 and a second node N2) preferably positioned in close proximity to the sample 100. A tuning capacitor $C_1$ is included and connected (between the first node N1 and a grounded output terminal TG) to the sample coil $L_s$, the sample coil and tuning capacitor substantially forming a (parallel) resonant circuit tuned to a selected Larmor frequency. A first impedance matching capacitor $2C_2$, connected between the sample coil $L_s$ and an upgrounded output terminal TU (connected, that is, between the first node N1 and the ungrounded output terminal), is also included. Finally, a second impedance matching capacitor $C_t$ is included and connected between the sample coil $L_s$ and the grounded output terminal TG (that is, connected between the second node N2 and the grounded output terminal). Consequently, the sample coil $L_s$ is connected in series circuit between the first and second impedance matching capacitors $2C_2$ and $C_t$ across the ungrounded and grounded output terminals TU and TG, respectively, so that the voltage across the sample coil is balanced. Preferably, an additional capacitor $C_s$ is connected in parallel circuit with the sample coil $L_s$ between the first node N1 and the second node N2, the parallel circuit formed by the sample coil and additional capacitor being connected in series circuit between the first and second impedance matching capacitors $2C_2$ and $C_t$ across the ungrounded and grounded output terminals TU and TG, respectively.

The probe circuit in accordance with the invention shown in FIG. 7 differs from that shown in FIG. 5. The tuning capacitor $C_1$ shown in FIG. 7 is no longer placed directly across the sample coil $L_s$, but instead has one side connected directly to ground. The capacitor $C_s$ helps to confine the large circulating current of the tuned circuit to the vicinity of the sample coil $L_s$, thereby improving the filling factor which is a measure of the fraction of the sample coil volume occupied by the sample 100. The capacitor $C_t$ performs a partial transformation to a lower impedance, thereby reducing the RF voltage on the transmission line. This helps to reduce dielectric losses across the transmission line. The value of the capacitor $C_t$ is selected somewhat larger than $2C_2$ in order to offset the imbalancing effect of the capacitor $C_1$ and to assure that the capacitor $2C_2$ is within range, irrespective of any variation in inductance between one sample coil $L_s$ and another. The result is that the sample coil $L_s$ remains relatively balanced with respect to ground, the transmission line does not have undue influence upon the filling factor or the circuit Q, and the entire probe circuit can be tuned outside the animal. The capacitors $C_s$ and $C_t$ are preferably small chip capacitors, such as ATC 100 ceramic chip capacitors manufactured by American Technical Ceramics, One Norden Lane, Huntington Station, N.Y. 11746, positioned as close to the sample coil $L_s$ as possible and insulated from the tissue with silicon sealer, namely, Aquarium Clear Sealant (100% silicon rubber) obtained from Dow Corning Corporation, Midland, Mich. 48640.

Measurements were obtained with the probe circuit in accordance with the invention shown in FIG. 7 having the sample coil $L_s$ implanted around the kidney of a laboratory rat. The sample coil $L_s$ comprised two turns of the insulated wire described above with half-inch diameter loops separated from one another by approximately one-quarter inch.

It is known that the inductance of a solenoid, such as the sample coil $L_s$, is given by the formula:

$$L = Or^2 N^2 / l$$

where
L is the inductance of the sample coil in henries
O is the permeability of free space and equals $4 \times 10^{-7}$ henries per meter;
r is the radius of the sample coil in meters;
N is the number of turns in the sample coil; and
l is the length of the sample coil in meters.

Solution of the formula for the inductance of the sample coil $L_s$ with these parametric values yields a value for inductance of approximately 100 nanohenries. The transmission line comprised approximately 10 cm of this wire in twisted pair. The capacitor $C_t$ was added by being inserted in the wire near the sample coil $L_s$. The values of the capacitors $C_t$ and $C_s$ were 13 pf and 27 pf, respectively. After insulating the capacitors $C_t$ and $C_s$ with silicon sealer, these capacitors were surgically implanted along with the sample coil $L_s$ into the animal. Later, the animal was anesthetized and connected to the capacitors $C_1$ and $2C_2$. The values of these capacitors were in the range 5 to 15 pf. The circuit Q was found to be 38.

The transmission line leads outside the animal at AA' were then reversed. This circuit configuration resembles that of the known probe circuit shown in FIG. 1, except that the capacitor $C_t$ performs a partial impedance match. The circuit Q for this arrangement was found to be 13. This dramatic drop in the Q of the probe circuit is evidence that the sample coil $L_s$ is unquestionably experiencing the effect of coil-to-ground parasitics which were substantially reduced by the use of the probe circuit in accordance with the invention shown in FIG. 7.

Now, the RF power in the sample coil $L_s$ is given by:

$$B_1 \approx 3(2\pi PQ/\omega_0 V)^{\frac{1}{2}} \qquad (6)$$

where P is the transmitter power in watts; Q is the quality factor or simply the Q of the probe circuit; $\omega_0/2\pi$ is the resonance frequency in megahertz; V is the volume of the sample coil in cubic centimeters; and $2B_1$ is the peak-to-peak amplitude of the RF magnetic field in gauss. Although as seen from equation (6), a high circuit Q also enhances the power in the sample coil $L_s$, the magnitude of $B_1$ is not the only quantity which must be optimized at the sample 100. The homogeneity of $B_1$, the rise and fall times of the RF pulse envelope, and the sensitivity or signal-to-noise of the probe circuit during the time that it is processing the nuclear signal must be considered.

By looking at equation (6), in order to have a large $B_1$ field, the volume of the sample coil $L_s$ must be kept to a minimum, and the circuit Q must be as large as possible. Repeating equation (3), the Q of a tuned, parallel RLC circuit is:

$$Q = R/\omega_0 L \qquad (3)$$

where R is the resistance in ohms; $\omega_0/2\pi$ is the resonance frequency in hertz; and L is the inductance in henries. The signal-to-noise ratio in a pulsed nuclear magnetic resonance analysis system is related to a number of parameters:

$$S/N \propto \theta \gamma I(+1) K (QV\omega_0 T_2^*/2\pi \beta T_1)^{\frac{1}{2}} \qquad (7)$$

where $\theta$ is the filling factor of the sample coil $L_s$, that is, a measure of the fraction of the sample coil volume occupied by the sample 100; $\gamma$ is the gyromagnetic ratio of the nucleus; I is the spin-quantum number of the nucleus; K is the composite of several fixed constants; Q, V, and $\omega_0$ have the values discussed above in connection with equation (6); $T_1$ and $T_1^*$ are the spinlattice and spin-spin relaxation times, respectively; and $\beta$ is the bandwidth of the receiver-detector system. See Farrar and Becker, supra, at page 39. Consequently, the signalto-noise ratio increases proportional to $Q^{\frac{1}{2}}$. As a result, the improvement of the Q of a nuclear magnetic resonance probe circuit in accordance with the invention translates to a concomitant improvement in the nuclear magnetic resonance signal-to-noise ratio.

From equation (7) it can be seen that in order to optimize the signal-to-noise ratio a large sample volume V and a large circuit Q are desired. The only constraint placed on the Q of the probe circuit from the point of view of processing the nuclear signals is that it satisfy the condition $Q<1.5\omega_0 t/2\pi$, where t is the time in seconds required for the FID signal to change appreciably and $\omega_0/2\pi$ is the resonance frequency in hertz.

Figure 8A:
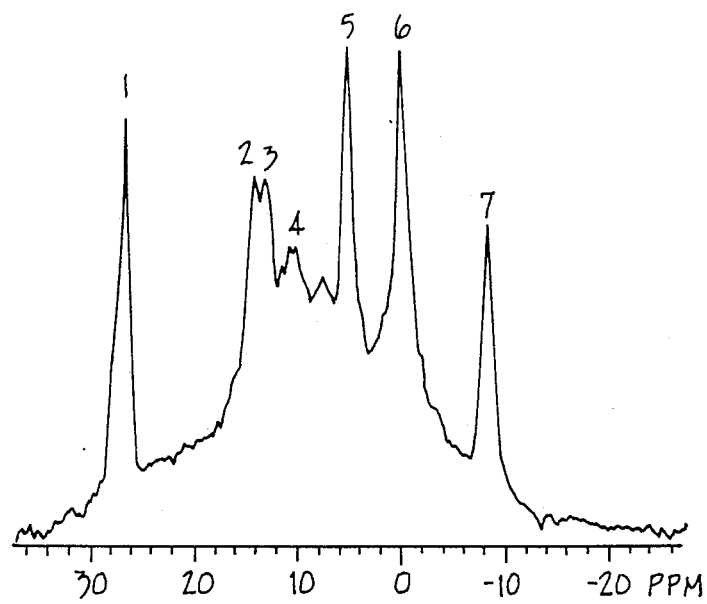
FIG. 8 shows $^{31}P$ spectra for two rat kidneys at 97.3 megahertz (MHz) using an implanted sample coil employing the tuning and impedance balancing nuclear magnetic resonance probe circuit in accordance with the invention shown in FIG. 7 (FIG. 8A) and an implanted sample coil with only a single tuning capacitor mounted near the sample coil (FIG. 8B).

The $^{31}P$ spectrum shown in FIG. 8A was obtained from a rat kidney using the probe circuit in accordance with the invention shown in FIG. 7. An attempt was made to compare this result with a spectrum obtained with the leads at AA' reversed in order to resemble the known probe circuit shown in FIG. 1. However, due to the excess capacitance on the sample coil $L_s$ in the presence of coil-to-ground parasitics, the latter circuit configuration could not be tuned to 97.3 MHz, the $^{31}P$ Larmor frequency, for analysis by the spectrometer. A spectrum was, therefore, obtained from a second rat kidney using a 10 pf tuning capacitor placed close to the sample coil $L_s$ in order to resemble the known probe circuit shown in FIG. 1. The $^{31}P$ spectrum obtained with this probe circuit is shown in FIG. 8B.

The analyses shown in FIG. 8 were performed on a home-built spectrometer using a Nicolet 1180 data system and a Cryomagnet Systems wide bore magnet. The spectra were obtained in 2600 scans using 45° pulses and 130-millisecond recycle times. A 30-Hz exponential filter was applied to the FID signals before Fourier transformation. The peaks shown in FIG. 8A are (1) methylene diphosphonic acid (Sigma Chemical Company), pH 8.9 in a capillary mounted on the sample coil $L_s$, (2) sugar phosphates, (3) inorganic phosphate, (4) urine phosphate and phosphodiesters, (5) γ ATP, (6) α ATP, NAD(H), and (7) β ATP, the latter three representing adenosine triphosphate.

Figure 8B:
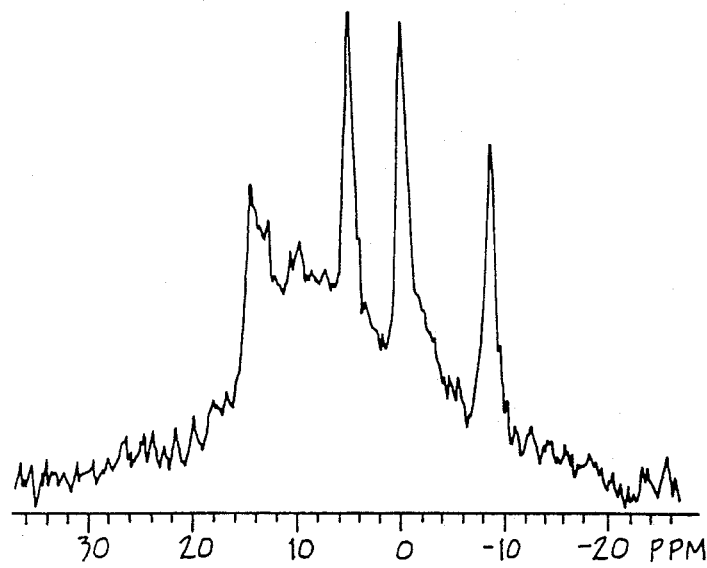

Comparison of the spectrum shown in FIG. 8B obtained with the known probe circuit with that in FIG. 8A obtained with the probe circuit in accordance with the invention shown in FIG. 7 illustrates that the signal-to-noise ratio for the β ATP peak was 16 for the former and 41 for the latter. This is a greater improvement in sensitivity than predicted by the change in circuit Q (13 versus 38) and likely results from the increased filling factor obtained with the partial impedance matching capacitor $C_t$ included in the probe circuit in accordance with the invention shown in FIG. 7.

It has been generally accepted that a Faraday shield can be used for eliminating dielectric losses. However, a Faraday shield can become ineffective if its size is also comparable to a wavelength. Moreover, use of a Faraday shield is not always a practical solution, for example, in the case of an implanted sample coil $L_s$. Under such circumstances, the use of the probe circuit in accordance with the invention shown in FIG. 7 can be more effective than a Faraday shield in raising the circuit Q.

The results obtained by the use of the various embodiments of the nuclear magnetic resonance probe circuit in accordance with the invention in improving the circuit Q of a model probe and an implanted probe suggest that these various embodiments can also be of use as surface probes, since the sources of sample losses are the same. While obtaining measurements with the model probe circuits, it was observed that by pressing the sample coil $L_s$ flat against one's hand, one could produce about the same influence upon the circuit Q and tuning sensitivity as placing one's finger inside the sample coil. In both cases, the probe circuit in accordance with the invention was equally successful in reducing these influences. Other conclusions can be drawn from the fact that the probe circuit in accordance with the invention was successful in reducing the influence of a finger placed within the sample coil $L_s$. In this situation, the electrical paths through one's own body to ground are no longer much less than a wavelength, as was assumed earlier. In fact, there is no nearby or well-defined ground, much less a grounded shield. The probe circuit in accordance with the invention effectively reduces parasitic losses in the form of radiative losses or transmission losses to an isolated conductive body, such as a human being. Such losses certainly occur in the whole-body nuclear magnetic resonance imaging systems being developed. Therefore, the probe circuit in accordance with the invention can be used in the relatively high frequency analytical realm (100 MHz range) as well as the relatively low imaging realm (10 MHz region).

In accordance with the invention, the preferred circuit configuration is that the tuning capacitor $C_1$ is positioned as close as possible to the sample 100 and the balanced impedance matching capacitors $2C_2$ are inserted in the leads to the sample coil $L_s$ between the tuning capacitor and the probe circuit output as shown in FIG. 5. In circumstances where the tuning capacitor $C_1$ cannot be positioned in close proximity to the sample coil $L_s$, such as in the case where the sample coil is implanted, however, a portion of the balanced impedance matching capacitance is preferably juxtaposed as close as possible to the sample coil as shown in FIG. 7.

The embodiments of the probe circuit in accordance with the invention shown in FIGS. 5 and 7 are implemented by the use of parallel resonant circuits. Alternatively, a series resonant circuit can be incorporated in the probe circuit with balanced tuning capacitors on each side of the sample coil $L_s$ for balancing the voltage across the sample coil, and a parallel impedance matching capacitor can be inserted. The conversion from a parallel resonant circuit to a series conversion circuit is well understood by those skilled in the art. However, conversion to a series resonant circuit from a parallel resonant circuit has certain practical ramifications, namely, more difficulty is experienced in impedance matching a series resonant circuit, and, furthermore, the impedance matching capacitor needed is several orders of magnitude (i.e., 1000) times as large. Furthermore, difficulty can be experienced in tuning a series resonant circuit, and a small change in tuning requires a significant change in the value of the impedance matching capacitor.

The foregoing description is offered primarily for purposes of illustration. While a variety of embodiments has been disclosed, it will be readily apparent to those skilled in the art that numerous other modifications and variations not mentioned above can still be made without departing from the spirit and scope of the invention as claimed below.

What is claimed is:

1. A nuclear magnetic resonance probe circuit having an improved quality factor in the presence of coil-toground parasitics encountered in nuclear magnetic resonance analysis of a specimen, comprising:

a sample coil having a nominal inductance, the sample coil being positioned in close proximity to the specimen;

a tuning circuit element connected to the sample coil, the sample coil and tuning circuit element substantially forming a resonant circuit tuned to a selected Larmor frequency; and a balanced impedance circuit means connected to the sample coil and tuning circuit element for controlling the voltage across the sample coil in the presence of leakage current from the sample coil through the specimen to ground in a manner to balance the leakage currents as seen from the ends of the sample coil, thereby reducing the influence of coil-to-ground parasitics additional to any coil-to-ground parasitic attributable solely to leakage current directly from the sample coil to ground.

2. The nuclear magnetic resonance probe circuit of claim 1 wherein the tuning circuit element comprises a tuning capacitor and the balanced impedance circuit means comprises a balanced impedance matching capacitance connected in series circuit with the sample coil for balancing the voltage across the sample coil.

3. The nuclear magnetic resonance probe circuit of claim 2 wherein the balanced impedance matching capacitance comprises a first impedance matching capacitor connected between the sample coil and an ungrounded output terminal and a second impedance matching capacitor connected between the sample coil and a grounded output terminal, the first impedance matching capacitor and the second impedance matching capacitor each having a capacitance which is approximately twice the capacitance of the tuning capacitor.

4. The nuclear magnetic resonance probe circuit of claim 1 wherein the selected Larmor frequency is approximately 100 MHz and the sample coil has a nominal inductance of approximately 100 nanohenries.

5. A nuclear magnetic resonance probe circuit having an improved quality factor in the presence of coil-to-ground parasitics encountered in nuclear magnetic resonance analysis of a specimen, comprising:

a sample coil having a nominal inductance, the sample coil being positioned in close proximity to the specimen;

a tuning capacitor connected to the sample coil, the sample coil and tuning capacitor substantially forming a resonant circuit tuned to a selected Larmor frequency;

a first impedance matching capacitor connected between the sample coil and an ungrounded output terminal; and a second impedance matching capacitor connected between the sample coil and a grounded output terminal;

the sample coil being connected in series circuit between the first and second impedance matching capacitors across the ungrounded and grounded output terminals;

the first and second impedance matching capacitors controlling the voltage across the sample coil in the presence of leakage current from the sample coil through the specimen to ground in a manner to balance the leakage currents as seen from the ends of the sample coil, thereby reducing the influence of coil-to-ground parasitics additional to any coil-to-ground parasitic attributable solely to leakage current directly from the sample coil to ground.

6. The nuclear magnetic resonance probe circuit of claim 5 wherein the tuning capacitor is connected in parallel circuit with the sample coil.

7. The nuclear magnetic resonance probe circuit of claim 6 wherein the tuning capacitor is positioned in close proximity to the specimen.

8. The nuclear magnetic resonance probe circuit of claim 5 wherein the tuning capacitor is connected between the grounded output terminal and a first junction, where the first impedance matching capacitor is connected to the sample coil, and wherein the second impedance matching capacitor is connected between the sample coil and a second junction, where the tuning capacitor is connected to the grounded output terminal.

9. The nuclear magnetic resonance probe circuit of claim 8, further comprising an additional capacitor connected in parallel circuit with the sample coil, the parallel circuit formed by the sample coil and additional capacitor being connected in series circuit between the first and second impedance matching capacitors across the ungrounded and ground output terminals.

10. The nuclear magnetic resonance probe circuit of claim 9 wherein the second impedance matching capacitor and the additional capacitor are positioned in close proximity to the specimen.

11. The nuclear magnetic resonance probe circuit of claim 5 wherein the tuning capacitor is adjustable for tuning the resonant circuit formed substantially by the sample coil and tuning capacitor to a selected Larmor frequency.

12. The nuclear magnetic resonance probe circuit of claim 8 wherein the tuning capacitor is adjustable for tuning the resonant circuit formed substantially by the sample coil and tuning capacitor to a selected Larmor frequency.

13. The nuclear magnetic resonance probe circuit of claim 5 wherein at least one of the first and second impedance matching capacitors is adjustable for matching the impedance across the ungrounded and grounded output terminals to a predetermined impedance.

14. The nuclear magnetic resonance probe circuit of claim 13 wherein the predetermined impedance is approximately 50 ohms.

15. The nuclear magnetic resonance probe circuit of claim 5 wherein the first impedance matching capacitor and the second impedance matching capacitor each have a capacitance which is approximately twice the capacitance of the tuning capacitor.

16. The nuclear magnetic resonance probe circuit of claim 5 wherein the selected Larmor frequency is approximately 100 MHz and the sample coil has a nominal inductance of approximately 100 nanohenries.

17. A nuclear magnetic resonance probe circuit having an improved quality factor in the presence of coil-to-ground parasitics encountered in nuclear magnetic resonance analysis of a specimen, comprising:

a sample coil having a nominal inductance, the sample coil being positioned in close proximity to the specimen, the sample coil being connected between a first node and a second node;

a tuning capacitor connected between the first and second nodes, the sample coil and tuning capacitor substantially forming a parallel resonant circuit resonant at a selected Larmor frequency;

a first impedance matching capacitor connected between the first node and an underground output terminal; and a second impedance matching capacitor connected between the second node and a grounded output terminal;

the parallel resonant circuit formed substantially by the sample coil and tuning capacitor being connected in series circuit between the first and second impedance matching capacitors across the ungrounded and grounded output terminals;

the first and second impedance matching capacitors controlling the voltage across the sample coil in the presence of leakage current from the sample coil through the specimen to ground in a manner to balance the leakage currents as seen from the ends of the sample coil, thereby reducing the influence of coil-to-ground parasitics additional to any coil-to-ground parasitic attributable solely to leakage current directly from the sample coil to ground.

18. The nuclear magnetic resonance probe circuit of claim 17 wherein the tuning capacitor is positioned in close proximity to the specimen.

19. The nuclear magnetic resonance probe circuit of claim 17 wherein the tuning capacitor is adjustable for tuning the parallel resonant circuit formed substantially by the sample coil and tuning capacitor to a selected Larmor frequency.

20. The nuclear magnetic resonance probe circuit of claim 17 wherein at least one of the first and second impedance matching capacitors is adjustable for matching the impedance across the grounded and ungrounded output terminals to a predetermined impedance.

21. The nuclear magnetic resonance probe circuit of claim 20 wherein the predetermined impedance is approximately 50 ohms.

22. The nuclear magnetic resonance probe circuit of claim 17 wherein the first impedance matching capacitor and the second impedance matching capacitor each have a capacitance which is approximately twice the capacitance of the tuning capacitor.

23. The nuclear magnetic resonance probe circuit of claim 17 wherein the selected larmor frequency is approximately 100 MHz and the sample coil has a nominal inductance of approximately 100 nanohenries.

24. A nuclear magnetic resonance probe circuit having an improved quality factor in the presence of coil-to-ground parasitics encountered in nuclear magnetic resonance analysis of a specimen, comprising:

a sample coil having a nominal inductance, the sample coil being positioned in close proximity to the specimen, the sample coil being connected between a first node and a second node;

a tuning capacitor connected between the first node and a grounded output terminal, the sample coil and tuning capacitor substantially forming a parallel resonant circuit resonant at a selected Larmor frequency;

a first impedance matching capacitor connected between the first node and an ungrounded output terminal; and a second impedance matching capacitor connected between the second node and the grounded output terminal;

the sample coil being connected in series circuit between the first and second impedance matching capacitors across the ungrounded and grounded output terminals;

the first and second impedance matching capacitors controlling the voltage across the sample coil in the presence of leakage current from the sample coil through the specimen to ground in a manner to balance the leakage currents as seen from the ends of the sample coil, thereby reducing the influence of coil-to-ground parasitics additional to any coil-to-ground parasitic attributable solely to leakage current directly from the sample coil to ground.

25. The nuclear magnetic resonance probe circuit of claim 24, further comprising an additional capacitor connected in parallel circuit with the sample coil between the first and second nodes, the parallel circuit formed by the sample coil and additional capacitor being connected in series circuit between the first and second impedance matching capacitors across the ungrounded and grounded output terminals.

26. The nuclear magnetic resonance probe circuit of claim 25 wherein the second impedance matching capacitor and the additional capacitor are positioned in close proximity to the specimen.

27. The nuclear magnetic resonance probe circuit of claim 24 wherein the tuning capacitor is adjustable for tuning the parallel resonant circuit formed substantially by the sample coil and tuning capacitor to a selected Larmor frequency.

28. The nuclear magnetic resonance probe circuit of claim 24 wherein at least one of the first and second impedance matching capacitors is adjustable for matching the impedance across the grounded and ungrounded output terminals to a predetermined impedance.

29. The nuclear magnetic resonance probe circuit of claim 28 wherein the predetermined impedance is approximately 50 ohms.

30. The nuclear magnetic resonance probe circuit of claim 24 wherein the first impedance matching capacitor and the second impedance matching capacitor each have a capacitance which is approximately twice the capacitance of the tuning capacitor.

31. The nuclear magnetic resonance probe circuit of claim 24 wherein the selected Larmor frequency is approximately 100 MHz and the sample coil has a nominal inductance of approximately 100 nanohenries.

32. A method for improving the signal-to-noise ratio of nuclear magnetic resonance signals detected in the presence of coil-to-ground parasitics encountered in nuclear magnetic resonance analysis of a specimen by a probe circuit having a sample coil and a tuning circuit element, the sample coil and tuning circuit element substantially forming a resonant circuit across an ungrounded output terminal and a grounded output terminal, the resonant circuit being tuned to a selected Larmor frequency, comprising the steps of:

positioning the sample coil in close proximity to the specimen; and inserting a balanced impedance circuit means connected to the sample coil and tuning circuit element for controlling the voltage across the sample coil in the presence of leakage current from the sample coil through the specimen to ground in a manner to balance the leakage currents as seen from the ends of the sample coil, whereby the influence of coil-to-ground parasitics additional to any coil-to-ground parasitic attributable solely to leakage current directly from the sample coil to ground is reduced.

33. The method of claim 32 wherein the tuning circuit element comprises a tuning capacitor and the balanced impedance circuit means comprises a balanced impedance matching capacitance for balancing the voltage across the sample coil.

34. The method of claim 33 wherein the balanced impedance matching capacitance comprises a first impedance matching capacitor connected between the sample coil and an ungrounded output terminal and a second impedance matching capacitor connected between the sample coil and a grounded output terminal, the sample being connected in series circuit between the first and second impedance matching capacitors across the ungrounded and grounded output terminals, the first impedance matching capacitor and the second impedance matching capacitor each having a capacitance which is approximately twice the capacitance of the tuning capacitor.

35. The method of claim 32 wherein the selected Larmor frequency is approximately 100 MHz and the sample coil has a nominal inductance of approximately 100 nanohenries.

36. A method for improving the signal-to-noise ratio of nuclear magnetic resonance signals detected in the presence of coil-to-ground parasitics encountered in nuclear magnetic resonance analysis of a specimen by a probe circuit having a sample coil and a tuning capacitor, the sample coil and the tuning capacitor substantially forming a resonant circuit across an ungrounded output terminal and a grounded output terminal, the resonant circuit being tuned to a selected Larmor frequency, and further having a first impedance matching capacitor between the sample coil and the ungrounded output terminal, comprising the steps of:

positioning the sample coil in close proximity to the specimen; and inserting a second impedance matching capacitor between the sample coil and the grounded output terminal;

the sample coil being connected in series circuit between the first and second impedance matching capacitors across the ungrounded and grounded output terminals;

the first and second impedance matching capacitors controlling the voltage across the sample coil in the presence of leakage current from the sample coil through the specimen to ground in a manner to balance the leakage currents as seen from the ends of the sample coil, whereby the influence of coil-to-ground parasitics additional to any coil-to-ground parasitic attributable solely to leakage current directly from the sample coil to ground is reduced.

37. The method of claim 36 wherein the tuning capacitor is connected in parallel circuit with the sample coil.

38. The method of claim 37, further comprising the step of positioning the tuning capacitor in close proximity to the specimen.

39. The method of claim 36 wherein the first impedance matching capacitor is inserted between the ungrounded output terminal and a first junction, where the tuning capacitor is connected to the sample coil, and wherein the second impedance matching capacitor is inserted between the sample coil and a second junction, where the tuning capacitor is connected to the grounded output terminal.

40. The method of claim 36 wherein the tuning capacitor is adjustable for tuning the resonant circuit formed substantially by the sample coil and tuning capacitor to a selected Larmor frequency, further comprising the step of adjusting the tuning capacitor for tuning the resonant circuit formed substantially by the sample coil and tuning capacitor to the selected Larmor frequency.

41. The method of claim 39 wherein the tuning capacitor is adjustable for tuning the resonant circuit formed substantially by the sample coil and tuning capacitor to a selected Larmor frequency, further comprising the step of adjusting the tuning capacitor for tuning the resonant circuit formed substantially by the sample coil and tuning capacitor to the selected Larmor frequency.

42. The method of claim 36 wherein at least one of the first and second impedance matching capacitors is adjustable for matching the impedance across the ungrounded and grounded output terminals to a predetermined impedance, further comprising the step of adjusting the at least one of the first and second impedance matching capacitors for matching the impedance across the ungrounded and grounded output terminals to the predetermined impedance.

43. The method of claim 42 wherein the predetermined impedance is approximately 50 ohms.

44. The method of claim 36 wherein the first impedance matching capacitor and the second impedance matching capacitor each have a capacitance which is approximately twice the capacitance of the tuning capacitor.

45. The method of claim 36 wherein the selected Larmor frequency is approximately 100 MHz and the sample coil has a nominal inductance of approximately 100 nanohenries.

* * * * *